(12) United States Patent
Chao et al.

(10) Patent No.: US 7,660,147 B2
(45) Date of Patent: Feb. 9, 2010

(54) PROGRAMMING METHOD FOR PHASE CHANGE MEMORY

(75) Inventors: Te-Sheng Chao, Taichung County (TW); Ming-Jung Chen, Taipei County (TW); Philip H. Yeh, Santa Monica, CA (US); Ming-Jinn Tsai, Hsinchu (TW)

(73) Assignees: Industrial Technology Research Institute, Hsinchu (TW); Powerchip Semiconductor Corp., Hsin-Chu (TW); Nany Technology Corporation., Taoyuan (TW); Promos Technologies Inc., Hsinchu (TW); Winbond Electronics Corp., Hsinchu (TW)

(*) Notice: Subject to any disclaimer, the term of this patent is extended or adjusted under 35 U.S.C. 154(b) by 0 days.

(21) Appl. No.: 11/959,108

(22) Filed: Dec. 18, 2007

(65) Prior Publication Data
US 2008/0151613 A1    Jun. 26, 2008

(30) Foreign Application Priority Data
Dec. 25, 2006    (TW) .............................. 95148760 A

(51) Int. Cl.
*G11C 7/00* (2006.01)

(52) U.S. Cl. ...................................... 365/148; 365/154

(58) Field of Classification Search ................. 365/148, 365/154
See application file for complete search history.

(56) References Cited

U.S. PATENT DOCUMENTS

| 4,225,946 | A | 9/1980 | Neale et al. |
|---|---|---|---|
| 6,570,784 | B2 | 5/2003 | Lowrey |
| 6,625,054 | B2 | 9/2003 | Lowrey et al. |
| 6,813,177 | B2 * | 11/2004 | Lowrey et al. ............... 365/148 |
| 6,914,801 | B2 | 7/2005 | Kostylev et al. |
| 7,126,846 | B2 * | 10/2006 | Ha et al. ...................... 365/163 |
| 2006/0203542 | A1 * | 9/2006 | Kurotsuchi et al. ......... 365/163 |
| 2006/0221679 | A1 | 10/2006 | Kang et al. |

* cited by examiner

*Primary Examiner*—Michael T Tran
(74) *Attorney, Agent, or Firm*—Quintero Law Office

(57) ABSTRACT

A programming method for a phase change memory based on the phase transformations between amorphous and crystalline phases is disclosed. The programming method comprises a current pulse with step waveform providing a first crystallization current pulse to the phase change memory and providing a second crystallization current pulse to the phase change memory. The first crystallization current pulse has a first rising edge, a first falling edge and a first peak current held for a first hold time. The second crystallization current pulse has a second peak current. The second peak current follows the first falling edge and is held for a second hold time.

20 Claims, 2 Drawing Sheets

PROGRAMMING METHOD FOR PHASE CHANGE MEMORY

BACKGROUND OF THE INVENTION

1. Field of the Invention

The invention relates to a phase change memory and, in particular, to a programming method for a phase change memory.

2. Description of the Related Art

With rapid development of portable electronic products, demand for nonvolatile semiconductor memories has increased. Phase change memory (PCM) has been considered as one of the leading next-generation nonvolatile semiconductor memory technologies due to some competitive advantages of speed, power saving, capacity, reliability, process integration, and lower cost. Despite of the great potential of PCM technology, the high RESET programming-current requirement makes it difficult to downsize the access transistors and becomes the critical challenge to realize a high density PCM array.

Recently, some methods, such as novel cell structures (edge contact, confined structure, etc.) and new materials (N-doped $Ge_2Sb_2Te_5$ (GST), O-doped material, etc.), have been developed to resolve the high RESET programming-current issue for PCMs. However, an adverse effect which may accompany with these methods is that the SET programming becomes more and more difficult so that the resistance can not be set as low as desired. As a result, incomplete crystallization state which results in a smaller sensing margin and degraded resistance uniformity may appear in the PCM cell after SET programming. To eliminate the incomplete SET programming, the common strategy is to extend the programming duration of SET current pulse for crystallization, as shown in FIG. 1. By adopting such an approach, a more complete crystallization in the active region can be achieved, thus leading to a larger sensing margin and improved resistance uniformity. However, increasing the pulse width of SET programming pulse also results in increased power consumption, overheating, and degraded speed performance.

BRIEF SUMMARY OF THE INVENTION

An embodiment of a programming method for a phase change memory (PCM) based on the phase transformations between amorphous phase and crystalline phase is disclosed. The programming method comprises a current pulse with step waveform providing a first crystallization current pulse to the PCM and providing a second crystallization current pulse to the PCM. The first crystallization current pulse has a first rising edge, a first falling edge, and a first peak current held for a first hold time. The second crystallization current pulse has a second peak current. The second peak current follows the first falling edge and is held for a second hold time.

An embodiment of a programming method for a PCM based on the phase transformations between amorphous phase and crystalline phase is disclosed. The programming method comprises a voltage pulse with step waveform providing a first crystallization voltage pulse to the PCM and providing a second crystallization voltage pulse to the PCM. The first crystallization voltage pulse has a first rising edge, a first falling edge, and a first peak voltage held for a first hold time. The second crystallization voltage pulse has a second peak voltage. The second peak voltage follows the first falling edge and is held for a second hold time.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Phase change memories (PCM) is mainly based on the fast and reversible thermally-induced phase transitions between amorphous phase and crystalline phase for some specific materials by applying adequate voltage or current pulses. Two distinct memory states can be identified by the difference of electrical resistance. The final state of PCM cell does not change with time after the removal of an applied power such that it provides the attribute of non-volatility. Most phase change materials are sulfide-based chalcogenide alloy. $Ge_2Sb_2Te_5$ (abbreviated as GST) alloy is one of the most popular phase change materials. Such material has also been used for the CD-RW or DVD-RW industries.

Figure 1:
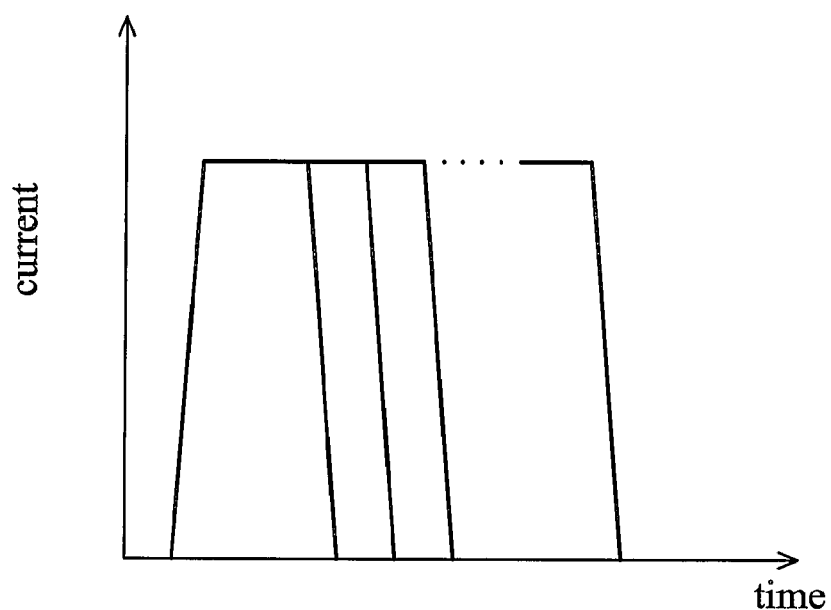
FIG. 1 is a schematic diagram of a conventional SET programming method for a phase change memory.
Figure 2:
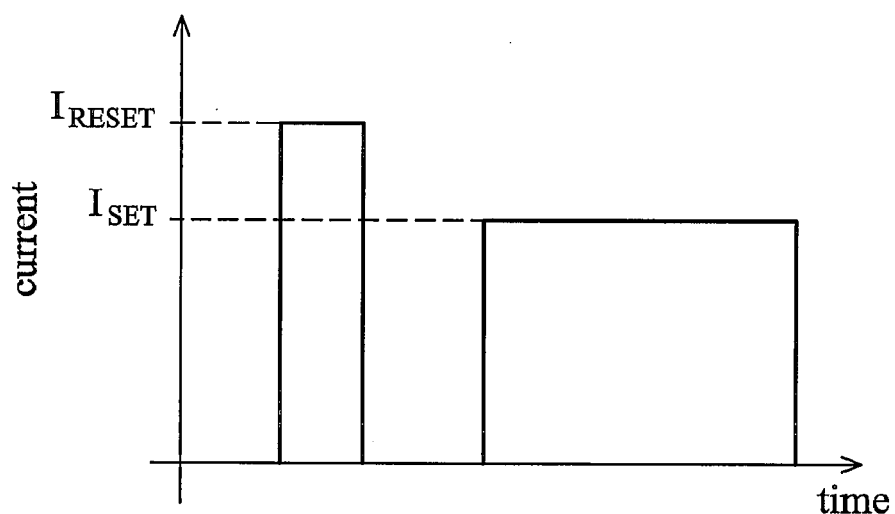
FIG. 2 is a schematic diagram of the current pulses for the crystallization and amorphization of a PCM cell.

The binary data storage in a PCM cell is accomplished by a fast and reversible phase transitions between amorphous phase and crystalline phase in an active region of chalcogenide material which is thermally induced by Joule heating of current pulse to compose the high resistive RESET state and the low resistive SET state. The current pulses with different durations and amplitudes are applied to reversibly switch the PCM cell between these two states. FIG. 2 is a schematic diagram of the current pulses for the crystallization and amorphization of a PCM cell. As shown in FIG. 2, the RESET pulse with short duration and high peak current is applied to heat the chalcogenide alloy above the melting point and then allow it to rapidly quench to achieve the high resistance RESET state corresponding to the amorphous phase. On the other hand, to crystallize the PCM cell, a SET pulse with long duration and low peak current is applied. As a result, the amorphous active region in the PCM cell is annealed at the temperature between the crystallization temperature and melting point of the chalcogenide alloy. Accordingly, the amorphous volume formed after RESET programming can be re-crystallized. As disclosed, the crystallization and amorphization in a PCM cell are similar to the writing and erasing operations thereof. As a result, the differences in electrical resistance between crystalline state and amorphous state can be used to achieve the purpose of data storage.

Figure 3:
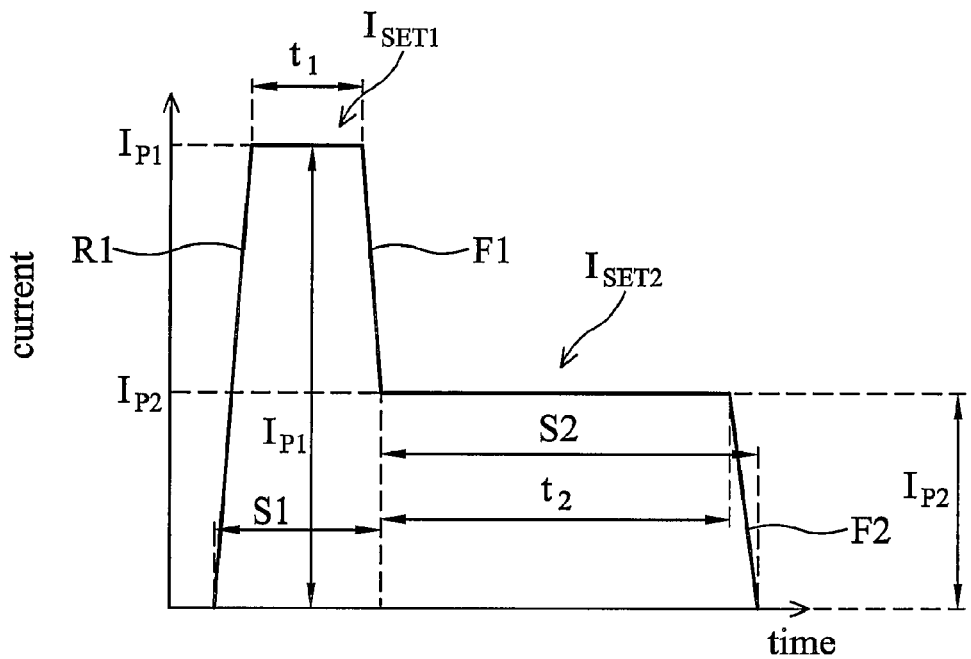
FIG. 3 is a schematic diagram of a SET programming method for a phase change memory according to an embodiment of the invention.

FIG. 3 is a schematic diagram of a programming method for a PCM according to an embodiment of the invention. The programming method comprises a first writing stage S1 and a second writing stage S2 following the first writing stage S1. The first writing stage S1 comprises providing a first crystallization current pulse $I_{SET1}$ to the PCM. The second writing stage S2 comprises providing a second crystallization current pulse $I_{SET2}$ to the PCM. The first crystallization current pulse $I_{SET1}$ has a first rising edge R1, a first falling edge F1, and a first peak current $I_{P1}$ held for a first hold time t1. The second crystallization current pulse $I_{SET2}$ has a second peak current $I_{P2}$ and no rising edge. The second peak current $I_{P2}$ follows the first falling edge F1 and is held for a second hold time t2. In other words, there is no time delay between the first and second writing stages according to the embodiment.

It is noted that the first peak current $I_{P1}$ and the second peak current $I_{P2}$ in the embodiment are fixed values. However, the scope of the invention is not limited thereto. For example, in practical applications, the first peak current $I_{P1}$ and the second peak current $I_{P2}$ may oscillate around some fixed values or present parabolic behaviors which depend on the circuit design.

The embodiment combines two different current pulses to crystallize a PCM. A current pulse with high peak current $I_{P1}$ and short duration t1 is first used to locally crystallize the amorphous phase in the active region of PCM cell. A subsequent current pulse with low peak current $I_{P2}$ and long duration t2 is then applied to completely crystallize the PCM. The SET programming method in the embodiment is shown in FIG. 3. The SET programming method comprises some parameters, especially the first peak current $I_{P1}$, the second peak current $I_{P2}$, the first hold time t1, and the second hold time t2, whose values can be adjusted. The SET programming pulse may be provided with an adjustable rising time and an adjustable falling time. Although the disclosed embodiment is composed of current pulses, the SET programming method according to the embodiment of the invention can also be performed by using voltage pulses. In such case, the adjustable parameters become peak voltages, hold times, and rising and falling times.

Figure 4:
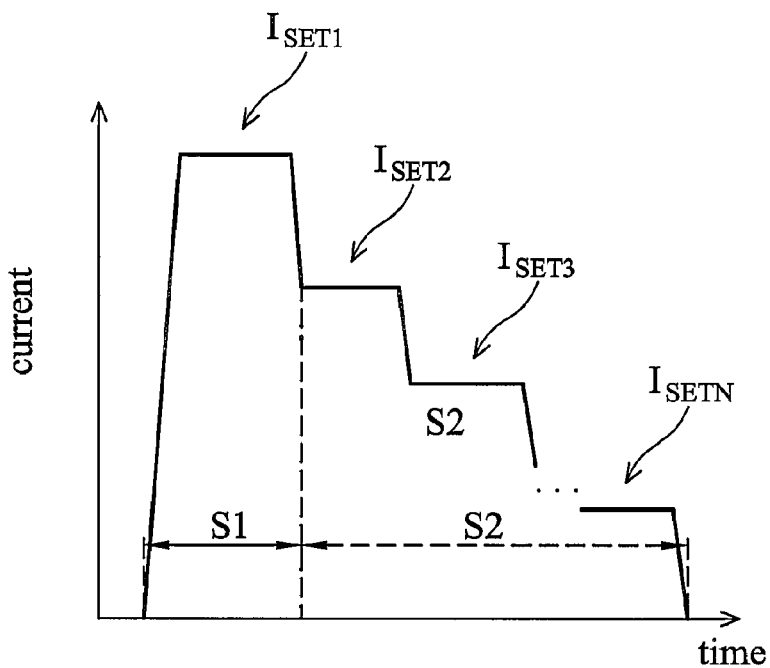
FIG. 4 is a schematic diagram of a SET programming method for a phase change memory according to another embodiment of the invention.

FIG. 4 is schematic diagram of a programming method for a PCM according to another embodiment of the invention. In addition to providing a first crystallization current pulse $I_{SET1}$ and a second crystallization current pulse $I_{SET2}$, the programming method further comprises providing a third crystallization current pulse $I_{SET3}$. The third crystallization current pulse $I_{SET3}$ has a third peak current $I_{P3}$ and no rising edge. The third peak current $I_{P3}$ follows the second falling edge F2 and is held for a third hold time t3. Accordingly, the programming method further comprises the third peak current $I_{P3}$ and the third hold time which are also adjustable. More specifically, the second peak current $I_{P2}$ is higher than the third peak current $I_{P3}$ and the second hold time t2 can be different from the third hold time t3. Although the disclosed programming method is compose of current pulses, the programming method according to the embodiment of the invention can also be performed by using voltage pulses. In addition, although the disclosed programming method for a PCM combines three pulses to accomplish the SET programming, the scope of the invention is not limited thereto. Those skilled in the art can modify the number of pulses and combine the pulses to accomplish the SET programming of a PCM.

The invention provides a programming method for a PCM. The programming method mainly combines two different current/voltage pulses to crystallize a PCM. A current/voltage pulse with high amplitude and short width is first used to locally crystallize the amorphous phase in the active region of PCM cell. A subsequent current/voltage pulse with low amplitude and long width is then applied to completely crystallize the PCM. The programming method proposed improving the crystallization of PCM cell in the disclosure can significantly reduce the SET resistance of the PCM cell after SET programming, resulting in a larger sensing margin (defined as $R_{RESET}/R_{SET}$). Compared with a conventional method which uses a square current/voltage with longer duration to be as the SET pulse for crystallization, the programming method proposed improving the crystallization of PCM cell in the disclosure can eliminate unnecessary power loss and prevent from overheating. In addition, the programming method in the disclosure also improves the reliability performance and the resistance distribution. Compared with the methods of the prior arts, the programming method according to the invention has higher degrees of freedom in modification of the waveform parameters and is more easily realized by circuitry.

While the invention has been described by way of example and in terms of preferred embodiment, it is to be understood that the invention is not limited thereto. To the contrary, it is intended to cover various modifications and similar arrangements as would be apparent to those skilled in the Art. Therefore, the scope of the appended claims should be accorded the broadest interpretation so as to encompass all such modifications and similar arrangements.

What is claimed is:

1. A programming method for a phase change memory, comprising:
    providing a first crystallization current pulse to the phase change memory, wherein the first crystallization current pulse has a first rising edge, a first falling edge and a first peak current held for a first hold time, wherein the first rising edge and the first falling edge are graduated slopes; and
    providing a second crystallization current pulse to the phase change memory, wherein the second crystallization current pulse has a second peak current and the second peak current follows the first falling edge and is held for a second hold time.

2. The programming method as claimed in claim 1, wherein the first peak current is higher than the second peak current.

3. The programming method as claimed in claim 1, wherein the first hold time is shorter than the second hold time.

4. The programming method as claimed in claim 1, further comprising providing a third crystallization current pulse, wherein the third crystallization current pulse has a third peak current and the third peak current follows a second falling edge of the second crystallization current pulse and is held for a third hold time.

5. The programming method as claimed in claim 4, wherein the second peak current is higher than the third peak current.

6. The programming method as claimed in claim 4, wherein the second hold time is different from the third hold time.

7. A programming method for a phase change memory, comprising:
    providing a first crystallization voltage pulse to the phase change memory, wherein the first crystallization voltage pulse has a first rising edge, a first falling edge and a first peak voltage held for a first hold time, wherein the first rising edge and the first falling edge are graduated slopes; and
    providing a second crystallization voltage pulse to the phase change memory, wherein the second crystallization voltage pulse has a second peak voltage and the second peak voltage follows the first falling edge and is held for a second hold time.

8. The programming method as claimed in claim 7, wherein the first peak voltage is higher than the second peak voltage.

9. The programming method as claimed in claim 7, wherein the first hold time is shorter than the second hold time.

10. The programming method as claimed in claim 7, further comprising providing a third crystallization voltage pulse, wherein the third crystallization voltage pulse has a third peak voltage and the third peak voltage follows a second falling edge of the second crystallization voltage pulse and is held for a third hold time.

11. The programming method as claimed in claim 10, wherein the second peak voltage is higher than the third peak voltage.

12. The programming method as claimed in claim 10, wherein the second hold time is different from the third hold time.

13. A programming method for a phase change memory, comprising:
 a first writing stage comprising providing a first pulse to the phase change memory, and the first pulse comprises a first rising edge and a first falling edge, wherein the first rising edge and the first falling edge are graduated slopes; and
 a second writing stage following the first writing stage and comprising providing at least a second pulse to the phase change memory.

14. The programming method as claimed in claim 13, wherein the first and second pulses respectively have a first peak and a second peak and the first peak is higher than the second peak.

15. The programming method as claimed in claim 13, wherein the first and second pulses respectively have a first hold time and a second hold time and the first hold time is shorter than the second hold time.

16. The programming method as claimed in claim 13, wherein the first and second pulses respectively have a falling edge and a peak and the peak follows the falling edge.

17. The programming method as claimed in claim 13, wherein the first pulse is a first current pulse or a first voltage pulse.

18. The programming method as claimed in claim 13, wherein the second pulse is a second current pulse or a second voltage pulse.

19. The programming method as claimed in claim 13, further comprising a third writing stage following the second writing stage and comprising providing a third pulse to the phase change memory, wherein the first, second and third pulses respectively have a first peak, a second peak and a third peak and the second peak is higher than the third peak.

20. The programming method as claimed in claim 19, wherein the third pulse is a third current pulse or a third voltage pulse.

* * * * *

UNITED STATES PATENT AND TRADEMARK OFFICE
CERTIFICATE OF CORRECTION

PATENT NO. : 7,660,147 B2 Page 1 of 1
APPLICATION NO. : 11/959108
DATED : February 9, 2010
INVENTOR(S) : Te-Sheng Chao et al.

It is certified that error appears in the above-identified patent and that said Letters Patent is hereby corrected as shown below:

on the coversheet, Item (75), the inventors should read:

Te-Sheng Chao, Taichung County (TW);
Ming-Jung Chen, Taipei County (TW);
Philip H. Yen, Santa Monica, CA (US);
Ming-Jinn Tsai, Hsinchu (TW)

Signed and Sealed this

Eighth Day of June, 2010

David J. Kappos
*Director of the United States Patent and Trademark Office*